US009087860B1

(12) United States Patent (10) Patent No.: US 9,087,860 B1
Banghart et al. (45) Date of Patent: Jul. 21, 2015

(54) FABRICATING FIN-TYPE FIELD EFFECT TRANSISTOR WITH PUNCH-THROUGH STOP REGION

(71) Applicant: GLOBALFOUNDRIES Inc., Grand Cayman (KY)

(72) Inventors: Edmund Kenneth Banghart, Pittsford, NY (US); Yanxiang Liu, Glenville, NY (US); Shesh Mani Pandey, Clifton Park, NY (US)

(73) Assignee: GLOBALFOUNDRIES INC., Cayman Islands, Grand Cayman (KY)

( * ) Notice: Subject to any disclaimer, the term of this patent is extended or adjusted under 35 U.S.C. 154(b) by 0 days.

(21) Appl. No.: 14/264,179

(22) Filed: Apr. 29, 2014

(51) Int. Cl.
| H01L 29/76 | (2006.01) |
| H01L 29/66 | (2006.01) |
| H01L 27/085 | (2006.01) |
| H01L 21/76 | (2006.01) |
| H01L 29/06 | (2006.01) |
| H01L 29/167 | (2006.01) |
| H01L 21/265 | (2006.01) |
| H01L 29/10 | (2006.01) |

(52) U.S. Cl.
CPC .... *H01L 29/66803* (2013.01); *H01L 21/26513* (2013.01); *H01L 21/26586* (2013.01); *H01L 29/0638* (2013.01); *H01L 29/1083* (2013.01); *H01L 29/167* (2013.01)

(58) Field of Classification Search
CPC ............ H01L 21/823412; H01L 21/823431; H01L 29/7843; H01L 27/088; H01L 27/1203
USPC ............ 257/288, 328, E29.001, E21.54, 255, 257/327, 353; 438/440
See application file for complete search history.

(56) References Cited

U.S. PATENT DOCUMENTS

| 7,009,250 | B1 * | 3/2006 | Mouli ........................ 257/347 |
| 2008/0265306 | A1 * | 10/2008 | Van Schaijk et al. ........ 257/324 |
| 2009/0278196 | A1 | 11/2009 | Chang et al. |
| 2011/0074498 | A1 * | 3/2011 | Thompson et al. ........... 327/543 |
| 2011/0079861 | A1 * | 4/2011 | Shifren et al. ............... 257/402 |
| 2011/0121404 | A1 * | 5/2011 | Shifren et al. ............... 257/392 |

OTHER PUBLICATIONS

C.R. Manoj et al., "Device Design and Optimization Considerations for Bulk FinFETs", IEEE Transactions on Electron Devices, vol. 55, No. 2, Feb. 2008, pp. 609-615.
O. Okano et al., "Process Integration Technology and Device Characteristics of CMOS FinFET on Bulk Silicon Substrate with sub-10 nm Fin Width and 20 nm Gate Length", 2005 IEEE, 2 pages.

* cited by examiner

*Primary Examiner* — Long K Tran
*Assistant Examiner* — Dzung Tran
(74) *Attorney, Agent, or Firm* — Kevin P. Radigan, Esq.; Heslin Rothenberg Farley & Mesiti P.C.

(57) ABSTRACT

Methods are provided for fabricating a fin-type field effect transistor(s), having a channel region within a fin. The methods include: establishing a protective material above an upper surface of the fin, and an isolation material adjacent to at least one sidewall of the fin, the isolation material being recessed down from the upper surface of the fin, for instance, for approximately a height of the channel region within the fin; and providing a punch-through stop dopant region within the fin below the channel region, the providing including implanting a punch-through stop dopant into the isolation material and laterally diffusing the punch-through stop dopant from the isolation material into the fin to form the punch-through stop region within the fin beneath the channel region.

20 Claims, 11 Drawing Sheets

FABRICATING FIN-TYPE FIELD EFFECT TRANSISTOR WITH PUNCH-THROUGH STOP REGION

BACKGROUND

Fin-type field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a vertical structure within or upon which are formed, for instance, one or more FinFETs or other fin devices, including capacitors, diodes etc. Advantageously, the fin structure helps to control current leakage through the transistor in the off-stage, and a double-gate or tri-gate structure may be employed to control other short channel effects.

Further enhancements in fin device structures and fabrication methods continue to be pursued for enhanced performance and commercial advantage.

BRIEF SUMMARY

Certain shortcomings of the prior art are overcome and additional advantages are provided through the provision, in one aspect, of a method which includes fabricating a fin-type field effect transistor, which includes a channel region within the fin. The fabricating includes: establishing a protective material above an upper surface of the fin, and an isolation material adjacent to at least one sidewall of the fin, the isolation material being recessed down from the upper surface of the fin, and providing a punch-through stop dopant region within the fin below the channel region, the providing including implanting a punch-through stop dopant into the isolation material and laterally diffusing the punch-through stop dopant from the isolation material into the fin to form the punch-through stop region within the fin beneath the channel region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used through-out different figures designate the same or similar components.

Disclosed herein, in part, is a method of fabricating a fin-type field effect transistor with, for instance, a controlled punch-through stop region within the fin below the channel region. In operation of a fin-type field effect transistor, when an appropriate voltage is applied on a gate structure, charge carriers (for instance, electrons (generated by n-type dopants) or holes (generated by p-type dopants)) flow from a source region to a drain region of the transistor through the channel region. Several issues may arise during FinFET fabrication processing. These issues could negatively impact performance or yield of integrated circuits containing the fin-type field effect transistors (FinFETs). For instance, a leakage path from the source region to the drain region may arise through a portion of the fin not covered by the gate, but below the channel region. This leakage current from the source region to the drain region below the channel region is generally referred to as a punch-through leakage current, which can cause an increase in undesirable static power consumption, particularly, in modern submicron-sized devices.

In order to reduce the punch-through leakage current, a punch-through stop dopant may be implanted within the fin. For instance, the punch-through stop dopant may include or be a dopant material that is different from the dopant materials employed during the fabrication of the source region and the drain region. As one example, the punch-through stop dopant may be implanted within the fin via, for instance, a high energy ion implantation process through the upper surface of the fin, followed by high temperature annealing process with parameters selected to facilitate forming a desired punch-through stop region within the fin. Disadvantageously, the high energy implantation process could result in an increased punch-through stop region size, as well as an increased concentration of punch-through stop dopants within the fin. This in turn, could cause degradation in the mobility of the charge carriers within the channel region, and therefore performance degradation of the resultant fin-type field effect transistor device(s).

Figure 1A:
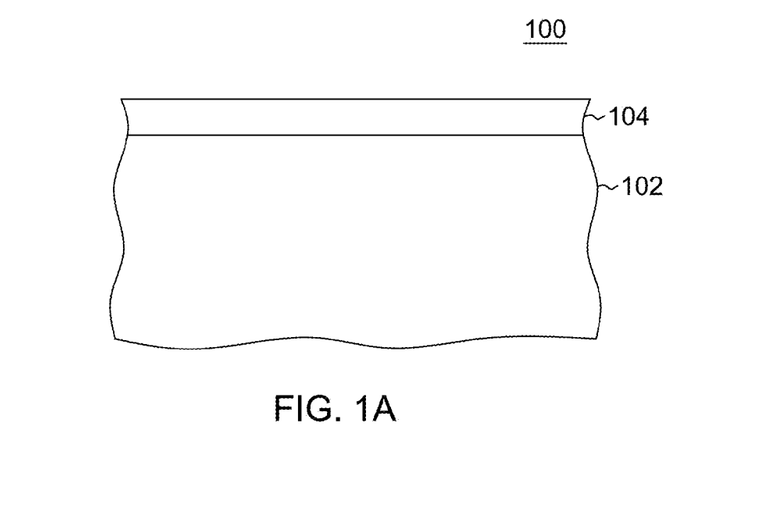
FIGS. 1A-1I depict one example of a process for fabricating a fin-type field effect transistor, in accordance with one or more aspects of the present invention.

By way of example, FIG. 1A depicts one embodiment of an intermediate structure 100 obtained during fabrication of a FinFET in accordance with one fabrication approach. In this example, structure 100 includes a substrate 102, such as a semiconductor substrate. For example, substrate 102 may be a bulk semiconductor material such as a bulk silicon wafer. As another example, substrate 102 may be or include any silicon-containing substrate including, but not limited to, silicon (Si), single crystal Si, crystalline Si, amorphous Si, silicon-on-nothing (SON), silicon-on-insulator (SOI), or silicon-on-replacement insulator (SRI) or the like. A layer of protective material 104 is shown disposed over substrate 102. In one embodiment, protective material 104 may be or include a nitride material such as, for instance, silicon nitride (SiN or $Si_3N_4$) or silicon oxynitride (SiON). By way of specific example, protective material 104 may be deposited over a silicon substrate 102 using any conventional deposition processes such as chemical vapor deposition (CVD), physical vapor deposition (PVD), atomic layer deposition (ALD) or plasma-enhanced versions of such processes. Protective material 104 may be provided to protect the underlying silicon substrate from damage during subsequent etch processes, and depending on the fabrication process, may also prevent silicon substrate 102 from being oxidized by exposure to an oxygen-containing environment during device fabrication.

Figure 1B:
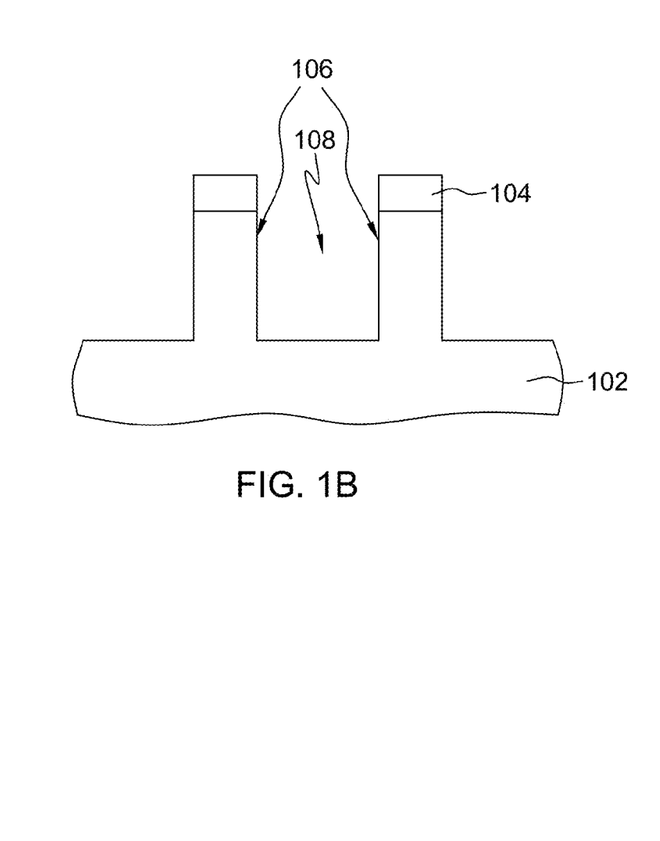

As depicted in FIG. 1B, one or more fins 106 are formed extending from substrate 102. By way of example, fins 106 may be formed by removing one or more portions of the substrate, creating openings 108 therein, and thereby creating one or more fins 106 from the same material as the substrate, such as, for example, a silicon semiconductor material. In one example, formation of fins 106 may be achieved by patterning the protective material layer 104 and substrate 102 using any of various approaches, including: direct lithography; sidewall image transfer technique; extreme ultraviolet technique (EUV); e-beam technique; litho-etch litho-etch; or litho-etch litho-freeze. Following patterning, the removal may be performed, for example, by any suitable etching process, such as an anisotropic dry etching process, for instance, reactive-ion-etching (RIE) in sulfur hexafluoride ($SF_6$). In one example, adjacent fins 106 are separated by a respective opening 108.

Figure 1C:
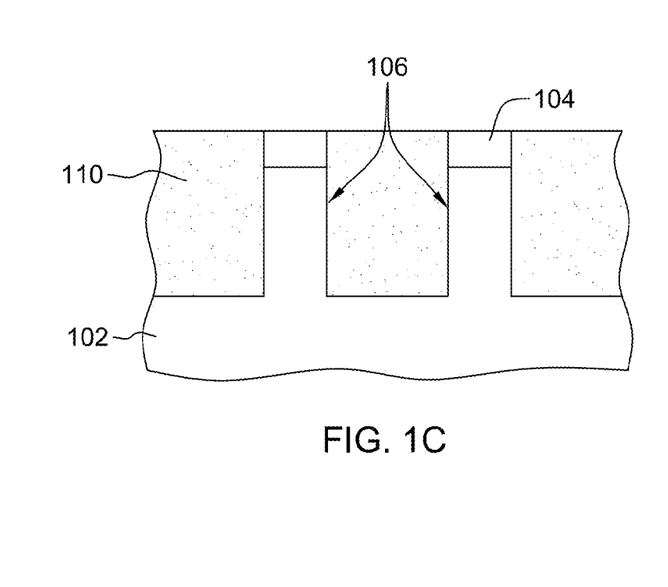

FIG. 1C illustrates the structure of FIG. 1B after the space between fins 106 has been filled with an isolation material 110. Isolation material 110, in one example, may be or include a dielectric material, and may be deposited using a variety of techniques such as, for example, chemical vapor deposition (CVD), plasma-enhanced CVD or sub-atmospheric pressure thermal CVD (SACVD) processes. The thickness of isolation material 110 may be (in one example) sufficient to allow subsequent planarization of the structure, for instance, to expose an upper surface of the protective material over the fins. By way of example, isolation material 110 may be fabricated of or include an oxide material. For instance, high-density plasma (HDP) oxide, high aspect ratio process (HARP) oxide or tetraethyl orthosilicate (TEOS)-based silicon dioxide may be deposited as isolation material 110 using, for example, a plasma-enhanced CVD process. As a specific example, a chemical vapor deposition process may be employed using tetraethyl orthosilicate (TEOS) and ozone ($O_3$) as reactants to deposit a tetraethyl orthosilicate based silicon dioxide isolation material in the space between adjacent fins 106, which will serve to electrically isolate the resultant fin-type field effect transistors.

Figure 1D:
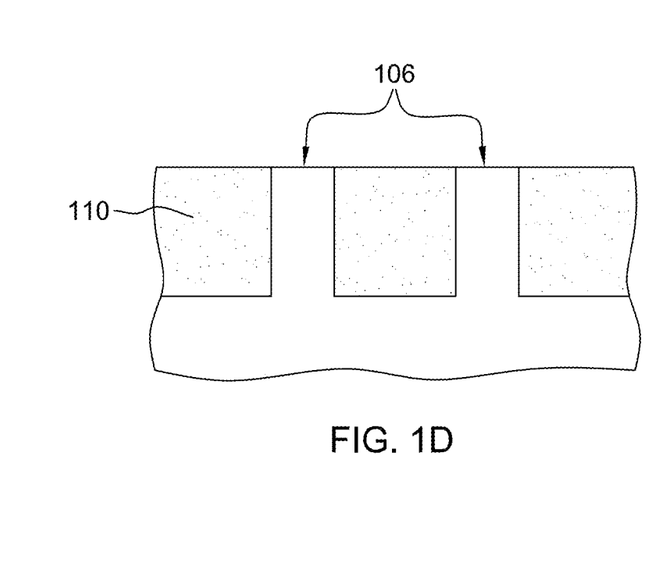

As illustrated in FIG. 1D, a non-selective chemical mechanical polish or an etch-back polish may be performed to remove protective material 104 (see FIG. 1C), along with an upper portion of isolation material 110, using (in one embodiment) the upper surfaces of fins 106, as an etch stop. As shown in FIG. 1D, this results in the height of the isolation material 110 being substantially equal to the height of the fins 106.

Figure 1E:
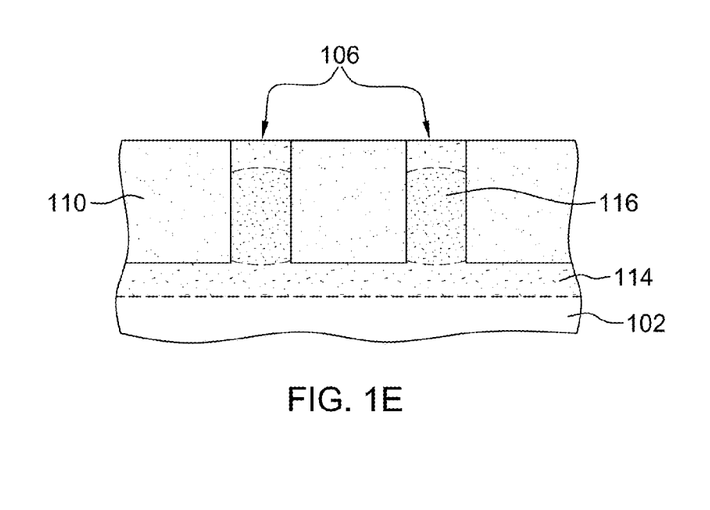

As depicted in FIG. 1E, one or more fins 106 may be implanted with a well dopant to create a well region 114 within fins 106 extending (in one example) into substrate 102. By way of example, the well dopant may be a p-type dopant or an n-type dopant. Note that as used herein, p-type dopant refers to the addition of an impurity to fins 106 (comprising, for instance, an intrinsic semiconductor material) to create deficiencies of valence electrons. Examples of a p-type dopant include boron, aluminum, gallium or indium, any one or more of which may be added to fins 106 comprising, for instance, silicon. The n-type dopant refers to the addition of impurities to fins 106 (comprising, for instance, an intrinsic semiconductor material), which contribute more electrons to the intrinsic material, and may include (for instance) phosphorus, antimony or arsenic.

In one example, one or more fins 106 may implanted with, for instance, a p-type well dopant such as, for instance, boron or a compound of boron (for instance, boron trifluoride ($BF_3$)), by employing an implantation dose of about 1e13 to 5e13 atom/$cm^2$, with an implantation energy of about 20 to 100 keV, to provide a desired concentration of p-type well dopant within fin(s) 106. In a specific example, the concentration of p-type well dopants implanted within fins 106 may be in the range of about 5e17 to 5e18 atoms/$cm^2$. In another example, one or more fins 106 may be implanted with, for instance, an n-type well dopant such as, for instance, phosphorus or a compound of phosphorus (for instance, heptaphosphane ($P_7H_3$)), by employing an implantation dose of about 1e13 to 5e13 atom/$cm^2$, with an implantation energy of about 50 to 200 keV, to provide a desired concentration of n-type well dopant within fin(s) 106. In a specific example, the concentration of n-type well dopants implanted within fins 106 may be in the range of about 5e17 to 5e18 atom/$cm^3$.

Continuing with FIG. 1E, one or more fins 106 may additionally be implanted with a punch-through stop dopant to create a punch-through stop region 116 within the fin(s) 106 (via, for instance, an ion implantation process). In one embodiment, the punch-through stop dopant may include or be a dopant material that is substantially similar to the well dopant. For instance, fins 106 may be implanted with a p-type punch-through stop dopant such as, for example, boron or a compound of boron (for instance, boron trifluoride ($BF_3$), octadecaborane ($B_{18}H_{22}$), employing an implantation dose of about 1e13 to 5e13 atom/$cm^2$, with an implantation energy of about 20 keV to 60 keV, to provide a concentration of punch-through stop dopants within fins 106 in the range of about 5e17 to 5e18 atom/cm$^3$.

Note that, in one embodiment, the depth to which the punch-through stop dopant (also referred to as depth of penetration) is implanted is dependent on the atomic mass of the punch-through stop dopants used and the implantation energy employed during the ion implantation process. For example, a low atomic mass punch-through stop dopant and/or high implantation energy facilitate a deeper penetration of the punch-through stop dopant within the fin. One skilled in the art will understand that the punch-through stop dopant could be implanted within the fin via, for instance, a high energy ion implantation process through the upper surface of the fin employing process conditions such as, for example, a high implantation dose at a high implantation energy, to facilitate implanting a desired concentration of punch-through stop dopants to a predetermined depth within the fins. In one example, a p-type punch-through stop dopant such as, for example, boron or a compound of boron could be implanted within the fin, employing a high implantation dose of about 5e13 atom/cm$^2$ with a high implantation energy of about 50 keV. In another example, an n-type punch-through stop dopant such as, for example, arsenic or a compound of arsenic, could be implanted within the fin, employing a high implantation dose of about 5e13 atom/cm$^2$ with a high implantation energy of about 80 keV. However, such a high energy implantation process may disadvantageously facilitate an undesirable or too high concentration of punch-through stop dopants accumulating within the fins.

The structure may be subjected to one or more annealing processes such as, for instance, a well implantation annealing process, and/or a punch-through stop annealing process, to facilitate diffusing of the well dopant and the punch-through stop dopant within a fin to achieve a desired configuration and distribution of well dopant and punch-through stop dopant within fins 106. Note that, as discussed above, in one embodiment, the well dopant and the punch-through stop dopand may be implanted within the fin at the same time, and may be subjected to a common high-temperature annealing process, to facilitate diffusing of the well dopant and the punch-through stop dopant within the fin. The diffusion of well dopant facilitates forming well region 114 within fins 106, extending (in one embodiment) into substrate 102, and the diffusion of punch-through stop dopant facilitates forming punch-through stop region 116 within the fins, for instance, within well region 114 therein. The one or more annealing processes may be performed using, for instance, a spike annealing process, laser annealing process, rapid thermal anneal (RTA) process, flash anneal or the like. In one embodiment, a well implantation annealing process may be performed using furnace annealing process at an elevated temperature of about 1000° C. to 1200° C. in the presence of inert gas such as, Argon or in vacuum, having a pressure of about 1 atm. In another embodiment, the punch-through stop annealing process may be performed using RTA annealing process at a temperature of about 950° C. to 1050° C. in the presence of inert gas such as, Argon or in vacuum, having a pressure of about 1 atm. Note that, in certain implementations, the well annealing process performed to define well region 114, may utilize substantially higher temperatures than the punch-through stop annealing process used to define the punch-through stop region 116 within the fins.

As one skilled in the art will understand, the crystal lattice structure of, for instance, the silicon fin material may be altered during the ion (i.e., well dopant) implantation process, resulting in the implanted well dopant being weakly bound to the silicon fin material. Upon performing a high temperature thermal anneal process, the crystal lattice structure of the silicon fin material may be further adjusted to position the well dopant further into the crystal lattice structure of the silicon fin material, thereby stabilizing the well dopant within the silicon fin material. However, the elevated temperatures employed during the well implantation process may disadvantageously facilitate an undesirable distribution and/or diffusing of the punch-through stop dopants within the fins, resulting in an increased punch-through stop region size within the fins which, for instance, may extend into the channel region of the fin. One skilled in the art will recognize that, an increased concentration of punch-through stop dopant, along with an increased punch-through stop region size could cause, for instance, a degradation in the mobility of the charge carriers within the channel region, and therefore performance degradation of the resultant fin-type transistor device(s).

Figure 1F:
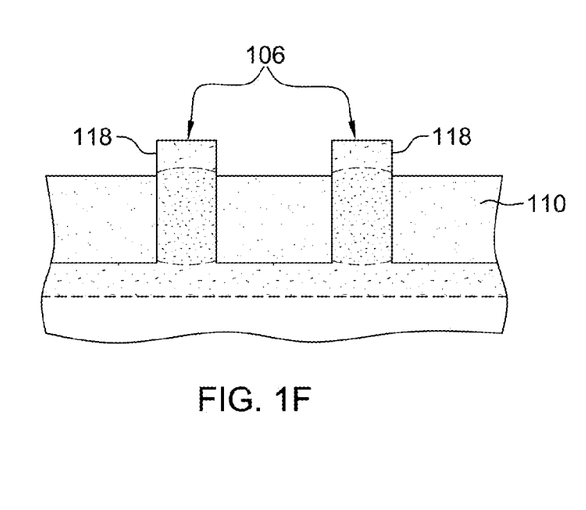

In FIG. 1F, one or more etch processes have been performed to recess a isolation material 110, and expose one or more sidewalls 118 of fins 106. By way of example, isolation material 110 may be selectively etched using conventional isotropic or anisotropic dry etching processes such as, reactive ion etching or plasma etching. In one example, isolation material 110 may be recessed to a height of about 70% to 80% of a height of fins 106. Note that isolation material 110 has been recessed down from an upper surface of fin to expose the fin sidewalls for approximately a desired height of the channel region within the fin.

Figure 1G:
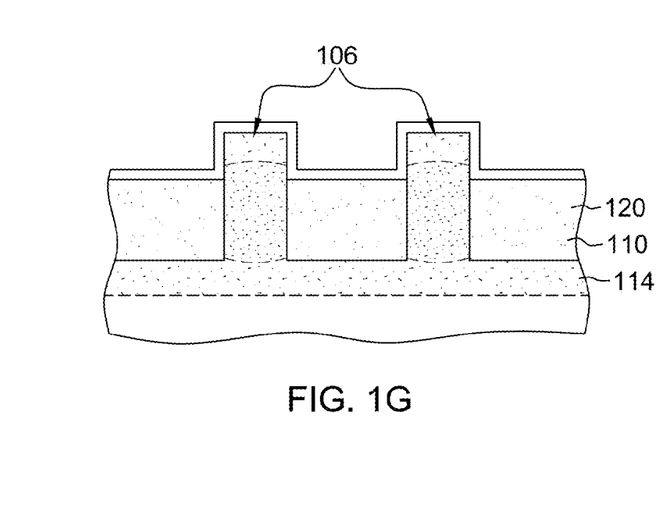

FIG. 1G illustrates the structure of FIG. 1F after provision of a conformal oxide layer 120 over the exposed portions of fins 106 and over the isolation material 110. In one embodiment, conformal oxide layer 120 may include or be fabricated as a thin oxide material, having a uniform thickness, and may be deposited using any conventional deposition process such as, for instance, chemical vapor deposition, plasma-enhanced CVD process, or an in-situ steam growth (ISSG) process. In one example, an in-situ steam growth (ISSG) process may be performed to conformally form oxidized polycrystalline silicon, and thereby provide conformal oxide layer 120.

Figure 1H:
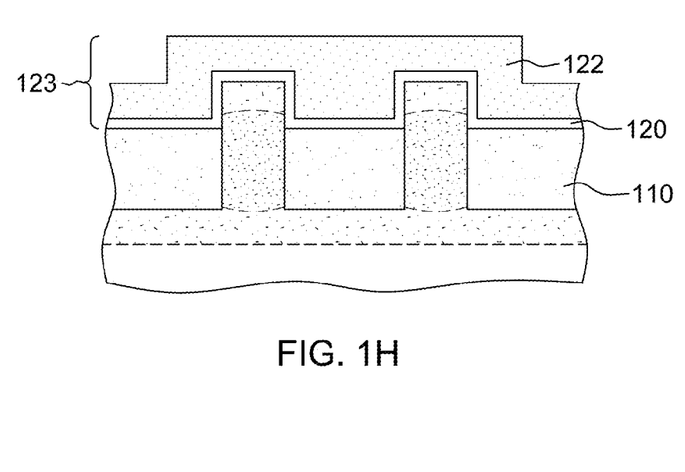

As depicted in FIG. 1H, a gate material 122 may be provided over conformal oxide layer 120 in forming a gate structure 123. Note that, in one embodiment, gate material 122 may include or be fabricated of a metal, and be formed as part of a gate-first fabrication process. Alternatively, in another embodiment, gate material 122 may include or be a sacrificial gate material, such as amorphous silicon (a-Si) or polycrystalline silicon (polysilicon), which may subsequently be replaced with a replacement gate material, as part of a gate-last fabrication process.

Figure 1I:
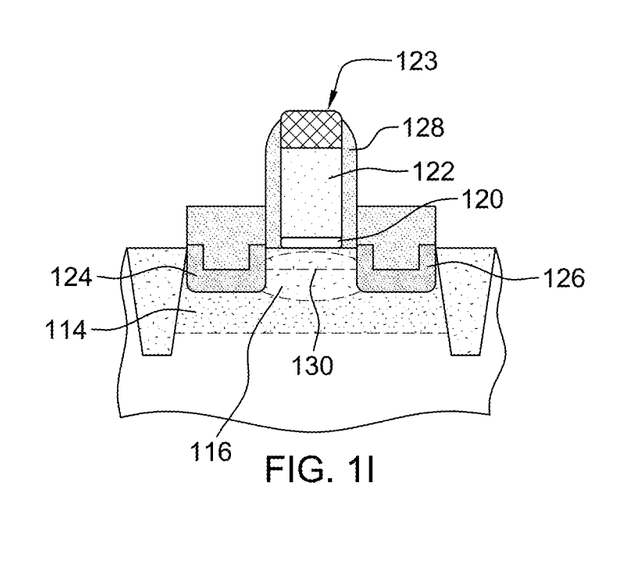

FIG. 1I depicts a transverse view of the structure of FIG. 1H, with the fabrication process having proceeded further to form a source region 124 and a drain region 126, followed by sidewall spacers 128 along the sidewalls of gate structure 123, as illustrated. Note that, in this example, channel region 130 underlies gate structure 123, and punch-through stop region 116 extends into channel region 130. By way of example, source region 124 and drain region 126 may be formed using any suitable techniques, including, for example, ion implantation and/or epitaxial growth of embedded source/drain materials. High temperature annealing may be performed to activate the source and drain regions, with the balance of the fin-type field effect transistor being formed, in one example, using a conventional process flow, including providing device contacts to the gate structure, source region and the drain region of fin-type field effect transistor.

Disclosed herein below, in one aspect, is an enhanced method for fabricating a fin-type field effect transistor having a channel region within a fin. The method includes, for instance: establishing a protective material above an upper surface of the fin, and an isolation material adjacent to at least one sidewall of the fin, the isolation material being recessed down to the upper surface of the fin, and providing a punch-through stop dopant region within the fin below the channel region. Providing the punch-through stop region includes implanting a punch-through stop dopant into the isolation material and laterally diffusing the punch-through stop dopant from the isolation material into the fin to form the punch-through stop region within the fin beneath the channel region.

In one implementation, the isolation material is recessed down from the upper surface of the fin for approximately a desired height of the channel region within the fin. In one embodiment, the implanting includes implanting only an upper portion of the isolation material to focus the laterally diffusing of the punch-through stop dopant into the fin in a region of the fin adjacent to the upper surface of the isolation material, and thereby facilitate control of the punch-through stop region location and size within the fin. In one example, the punch-through stop dopant may be implanted into the isolation material to a depth, for instance, of about 1 nm to 20 nm. The implanting may also include implanting the punch-through stop dopant into the isolation material at an implanting angle which is normal to the upper surface of the fin and/or the upper surface of the isolation material. In one implementation, the implanting includes implanting the punch-through stop dopant into the isolation material with an implantation energy which facilitates defining a desired punch-through stop region size within the fin. For instance, the implantation energy may be within an energy range of about 1 to 20 keV depending on the dopant employed.

In another embodiment, the fabricating may include implanting a well dopant into the fin to provide a well region within the fin, with the channel region of the transistor to reside within the well region of the fin. In one example, the well dopant may include or be fabricated of an n-type dopant such as, for example, phosphorus, antimony or arsenic. In another example, the well dopant may include or be fabricated of a p-type dopant such as, for example, boron, aluminum, gallium or indium. Fabricating the FinFET may further include performing an annealing process, subsequent to the implanting of the well dopant into the fin, to diffuse the well dopant into the fin. In one aspect, the implanting of the punch-through stop dopant into the isolation material may occur after the diffusing of the well dopant within the fin, with the punch-through stop region being disposed, at least in part, within the well region, beneath the desired channel region.

Further, fabricating the transistor may include implanting the well dopant into the fin with a first implantation energy, and implanting the punch-through stop dopant into the isolation material with a second implantation energy, the first implantation energy being higher than the second implantation energy. In one example, the second implantation energy is within an energy range of about 1 to 20 keV. By way of example, the well dopant includes a first dopant material, and the punch-through stop dopant includes a second dopant material. Note that the first dopant material and the second dopant material may comprise or be the same dopant materials such as, for example, boron or phosphorus.

Further, the establishing may include depositing the isolation material over the fin and selectively removing the isolation material to recess the isolation material down from the upper surface of the fin. The fin may include opposite first and second sidewalls, and the isolation material may be recessed down from the upper surface of the fin along the first and second sidewalls on the opposite sides of the fin. The implanting may further include implanting the punch-through stop dopant into the isolation material so as to facilitate laterally diffusing of the punch-through stop dopant into the fin through both the first and the second sidewalls of the fin. In a further embodiment, the implanting includes implanting an additive dopant such as, for example, a carbon dopant material, along with the punch-through stop dopant into the isolation material, to control lateral diffusing of the punch-through stop dopant into the fin, and thereby facilitate controlling the punch-through stop region size and/or configuration within the fin.

FIGS. 2A-2J depict an example of an enhanced method for fabricating a fin-type field effect transistor. Advantageously, as described below, a better controlled punch-through stop region within the fin below the channel region is attained, in accordance with one or more aspects of the present invention.

Figure 2A:
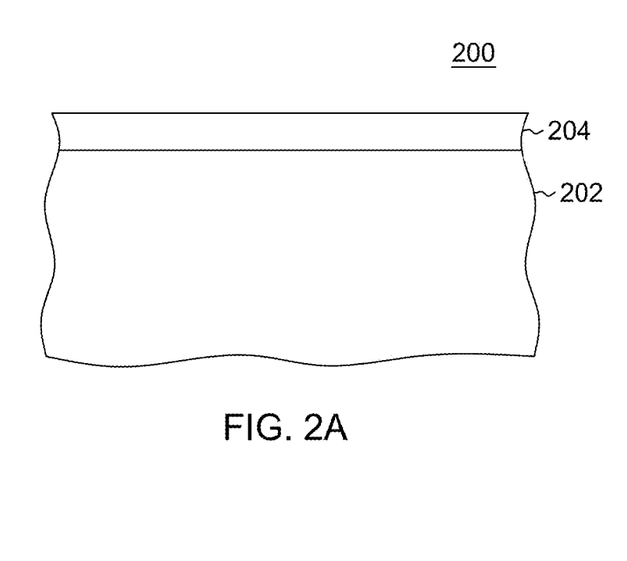
FIG. 2A is a cross-sectional elevational view of a structure obtained during another fin-type field effect transistor fabrication process, in accordance with one or more aspects of the present invention.

FIG. 2A illustrates one embodiment of an intermediate structure 200 obtained during fabrication of a FinFET, in accordance with one or more aspects of the present invention. In the example shown, structure 200 includes a substrate 202, such as a semiconductor substrate. For example, substrate 202 may be a bulk semiconductor material such as a bulk silicon wafer. As another example, substrate 202 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 202 may in addition or instead include various isolations, dopings and/or device features. For instance, substrate 202 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

A layer of protective material 204 may be disposed over substrate 202. In one embodiment, protective material 204 may be or include a nitride material such as, for instance, silicon nitride (SiN or $Si_3N_4$) or silicon oxynitride (SiON). By way of specific example, protective material 204, having a thickness of about 30 to 50 nm, may be deposited over a silicon substrate 202 using any conventional deposition process, such as chemical vapor deposition (CVD), physical vapor deposition (PVD), atomic layer deposition (ALD) or plasma-enhanced versions of such processes. Protective material 204 may be provided to protect the underlying silicon substrate from damage during subsequent etch processes, and depending on the fabrication process, may also prevent silicon substrate 202 from being oxidized by exposure to an oxygen-containing environment during device fabrication.

Figure 2B:
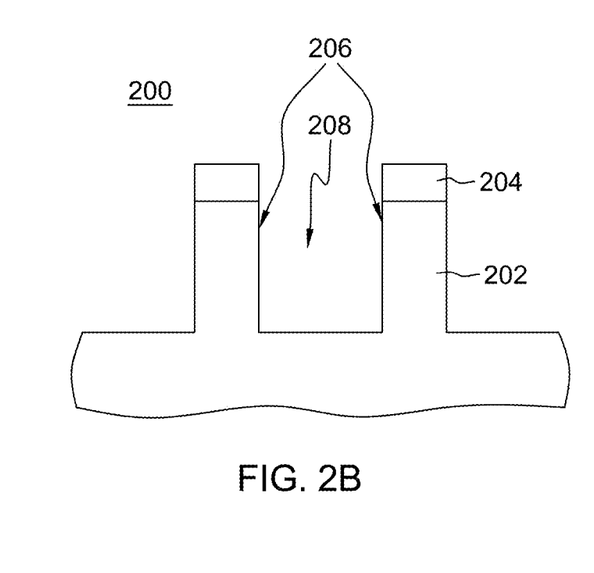
FIG. 2B depicts the structure of FIG. 2A, after forming one or more fins, in accordance with one or more aspects of the present invention.

As depicted in FIG. 2B, one or more fins 206 are formed extending from substrate 202. By way of example, fins 206 may be formed by removing one or more portions of substrate 202, creating openings 208 therein, to define one or more fins 206 from the same material as the substrate, such as, for example, a silicon semiconductor material. In one example, formation of fins 206 may be achieved by patterning the protective material 204 and substrate 202 using any of various approaches, including: direct lithography; sidewall image transfer technique; extreme ultraviolet technique (EUV); e-beam technique; litho-etch litho-etch; or litho-etch litho-freeze. Following patterning, the removal may be performed by any suitable etching process, such as an anisotropic dry etching process, for instance, reactive-ion-etching (RIE) in sulfur hexafluoride ($SF_6$). In one example, adjacent fins 206 may be separated by a respective opening 208. Although the following numbers are relative and fin heights could vary, as one specific example, a fin 206 may have a height in a range of about 30 to 45 nm.

Figure 2C:
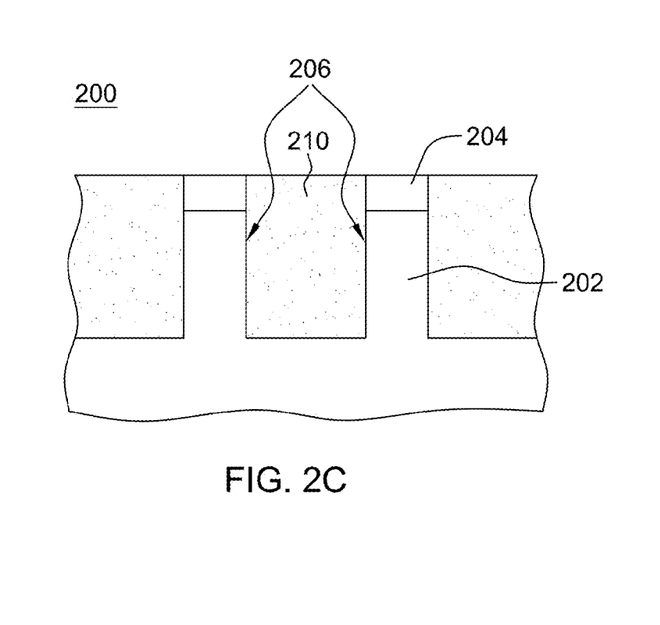
FIG. 2C depicts the structure of FIG. 2B, after providing an isolation material layer over the fin(s) and planarizing the isolation material to an upper surface of the protective material over the fins, in accordance with one or more aspects of the present invention.

FIG. 2C illustrates the structure of FIG. 2B after the spaces between fins 206 have been filled with an isolation material 210. Isolation material 210, in one example, may be or include a dielectric material, and may be deposited using a variety of techniques such as, for example, chemical vapor deposition (CVD), plasma-enhanced CVD or sub-atmospheric pressure thermal CVD (SACVD) processes. The thickness of isolation material 210 may be (in one example) sufficient to allow subsequent planarization of the structure, for instance, to expose an upper surface of the protective material over the fins. By way of example, isolation material 210 may be fabricated of or include an oxide material. For instance, high-density plasma (HDP) oxide, high aspect ratio process (HARP) oxide or tetraethyl orthosilicate (TEOS)-based silicon dioxide may be deposited as isolation material 210, using a plasma-enhanced CVD process. As a specific example, a chemical vapor deposition process may be employed using tetraethyl orthosilicate (TEOS) and ozone ($O_3$) as reactants to deposit a tetraethyl orthosilicate based silicon dioxide isolation material in the spaces between fins 206, which will serve to electrically isolate the resultant fin-type field effect transistors.

Figure 2D:
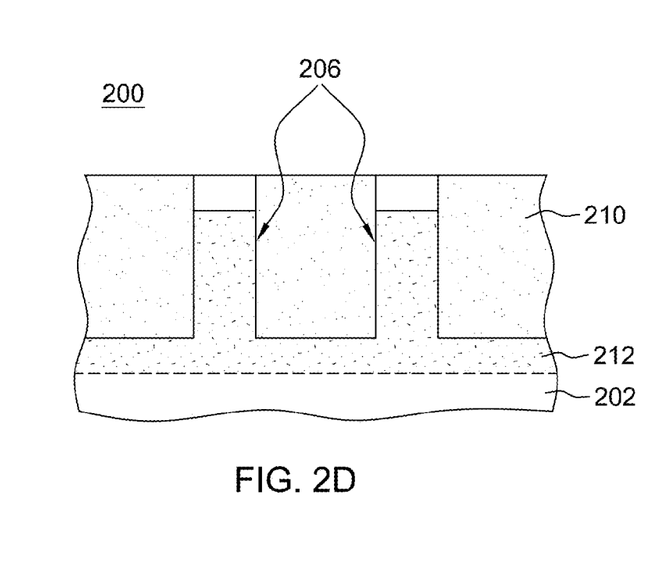
FIG. 2D depicts the structure of FIG. 2C, with a well region having been provided within the fin(s), in accordance with one or more aspects of the present invention.

As depicted in FIG. 2D, one or more fins 206 may be implanted with a well dopant, for instance, by implanting through protective material 204, to form a well region 212. By way of example, the well dopant may be a p-type dopant or an n-type dopant. Note that as used herein, p-type dopant refers to the addition of an impurity to fins 206 (comprising, for instance, an intrinsic semiconductor material) to create deficiencies of valence electrons. Examples of a p-type dopant may include boron, aluminum, gallium or indium, any one or more of which may be added to fins 206 comprising, for instance, silicon material. An n-type dopant refers to the addition of impurities to fins 206 (comprising, for instance, an intrinsic semiconductor material), which contribute more electrons to the intrinsic material, and may include (for instance) phosphorus, antimony or arsenic.

In one example, one or more fins 206 may implanted with a p-type well dopant such as, for instance, boron or a compound of boron (for instance, boron trifluoride ($BF_3$), octadecaborane ($B_{18}H_{22}$)), employing an implantation dose of about 1e13 to 5e13 atom/cm$^2$, with an implantation energy of about 20 to 100 keV, to provide a concentration of well dopants within fins 206. For instance, the concentration of p-type well dopants implanted within fins 206 may be in the range of about 5e17 to 5e18 atom/cm$^3$. In a specific example, fins 206 may be implanted using boron trifluoride ($BF_3$) as an ion source. For instance, boron trifluoride gas, having been supplied into an ion implanter, dissociates into $BF_2^+$ molecular ions, which may be utilized for the implantation of boron, using process conditions such as, implantation dose of about 5e13 atom/cm$^2$, and implantation energy of about 100 keV. In another example, one or more fins 206 may be implanted with, for instance, an n-type well dopant such as, for instance, phosphorus or a compound of phosphorus (for instance, heptaphosphane ($P_7H_3$)), by employing an implantation dose of about 1e13 to 5e13 atom/cm$^2$, with an implantation energy of about 50 to 200 keV, to provide a desired concentration of n-type well dopant within fin(s) 206. In such an example, the concentration of n-type well dopants implanted within fins 206 may be in the range of about 5e17 to 5e18 atom/cm$^3$.

Continuing with FIG. 2D, structure 200 may be subjected to a well implant anneal process to facilitate diffusing of the well dopant within the fins, to achieve a desired configuration and distribution of the well dopant within well region 212 in fins 206 and substrate 202. Note that, the crystal lattice structure of the silicon fin material, for instance, may be altered during the ion (i.e., well dopant) implantation process, resulting in the implanted well dopant being weakly bound to the silicon fin material. Upon performing a high temperature annealing process, the crystal lattice structure of the silicon fin material may be adjusted to better position the well dopant into the crystal lattice structure of the silicon fin material, thereby stabilizing the well dopant within the silicon fin material. The high temperature annealing process may be performed using, for instance, a spike annealing, laser annealing, rapid thermal annealing (RTA), flash annealing or the like. In one example, a well implant annealing process may be performed using furnace annealing process at an elevated temperature of about 1000° C. to 1200° C. in the presence of inert gas such as, Argon (Ar), having a pressure of about 1.

Figure 2E:
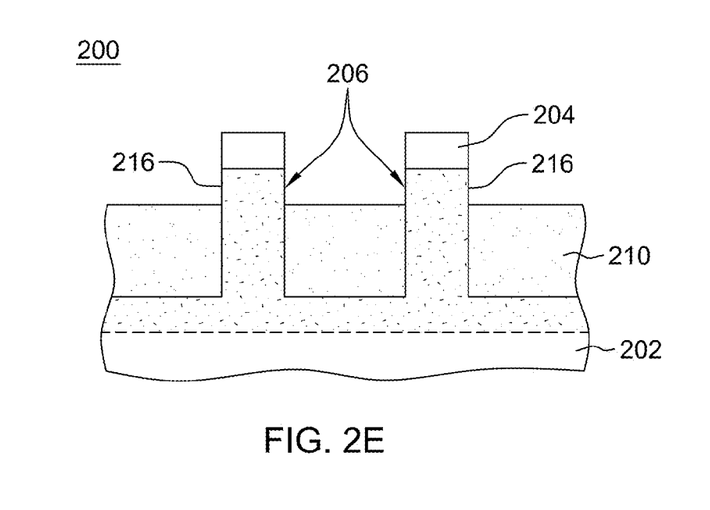
FIG. 2E depicts the structure of FIG. 2D with the isolation material having been recessed down from the upper surfaces of the fins, in accordance with one or more aspects of the present invention.

As depicted in FIG. 2E, one or more selective etch processes are performed to recess isolation material 210, for instance, down from upper surfaces 214 of fins 206, in accordance with one or more aspects of the present invention. By way of example, isolation material 210 may be selectively etched using one or more isotropic or anisotropic dry etching processes such as, reactive ion etching or plasma etching, and is etched to expose one or more sidewalls 216 of fins 206. In one example, isolation material 210 may be recessed to a height of about 70% to 80% of a height of fins 206. Note that, as further discussed below, in one embodiment, the isolation material 210 is recessed down from upper surfaces 214 of fins 206 for approximately a desired height or location for the punch-through stop regions to be established within the fins co-planar with an upper portion of the isolation material, as described below. This height will also define, in one aspect, the depth of the channel regions within the fins. This selective recessing of the isolation material advantageously facilitates focusing lateral diffusion of the punch-through stop dopant into the fin in the desired region adjacent to the upper surface of the isolation material, and thereby facilitates achieving a desired punch-through stop region configuration at a desired depth within the fins.

Figure 2F:
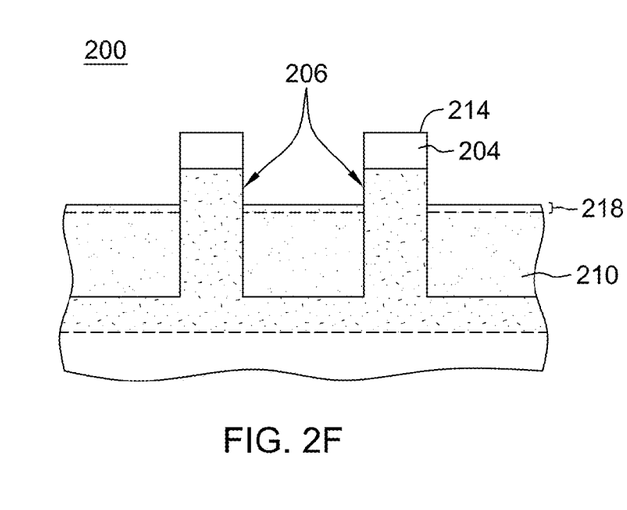
FIG. 2F depicts the structure of FIG. 2E, with a punch-through stop dopant being implanted into the isolation material in an upper region thereof, in accordance with one or more aspects of the present invention.

As illustrated in FIG. 2F, an upper portion 218 of isolation material 210 may subsequently be implanted with a punch-through stop dopant via, for instance, an ion implantation process, in accordance with one or more aspects of the present invention. In one example, the punch-through stop dopant may include or be a dopant material that is substantially similar to the well dopant. For instance, the punch-through stop dopant may be a p-type dopant such as, for example, boron, aluminum, gallium or indium being added to upper portion 218 of isolation material 210. In a specific example, isolation material 210 may implanted with a p-type well dopant such as, for instance, boron or a compound of boron (for instance, boron trifluoride ($BF_3$), octadecaborane ($B_{18}H_{22}$)), by employing an implantation dose of about 1e12 to 5e13 atom/cm$^2$, with an implantation energy of about 5 to 20 keV, to provide a concentration of punch-through stop dopants within the upper portion 218 of the isolation material. In this example, the concentration of punch-through stop dopants implanted within isolation material may be in the range of about 1e17 to 1e18 atom/cm$^3$.

Note that in one specific example, isolation material 210 may be implanted using boron trifluoride ($BF_3$) as an ion source. Boron trifluoride gas, having been supplied into an ion implanter, dissociates into $BF_2^+$ molecular ions, which may be utilized for the implantation of a low-energy boron, using process conditions such as, implantation dose of about 1e13 atom/cm$^2$, and implantation energy of about 5 keV. In another example, the punch-through stop dopant may be an n-type dopant such as, for example, phosphorus, arsenic, or antimony. In another specific example, isolation material 210 may be implanted with, for instance, an n-type punch-through stop dopant such as, for instance, phosphorus or a compound of phosphorus (for instance, heptaphosphane ($P_7H_3$)), by employing an implantation dose of about 1e12 to 5e13 atom/$cm^2$, with an implantation energy of about 5 to 20 keV, to provide a desired concentration of n-type punch-through stop dopant within upper portion 218 of isolation material 210. In such an example, the concentration of n-type punch-through stop dopants implanted within isolation material 210 may be in the range of about 1e17 to 1e18 atom/$cm^3$.

Note that, in one embodiment, isolation material 210 has been implanted with the punch-through stop dopant via, for instance, an ion implantation process employing controlled process parameters such as, for example, implantation energy and/or implantation dose, so as to facilitate implanting only an upper portion of the isolation material with a desired concentration of the punch-through stop dopant(s), as illustrated. In one example, the punch-through stop dopant may be implanted into the isolation material to a depth of about 1 nm to 20 nm. Further, the punch-through stop dopant tends to migrate beyond the intended upper portion of the isolation material during the ion implantation process. This migration of the punch-through stop dopant is generally referred to as implantation straggle. As is known, longitudinal straggle is a measure of the range of punch-through stop dopants into the thickness of the isolation material, while a lateral straggle is a measure of lateral distribution of the punch-through stop dopants within the upper portion of the isolation material. Note that, for instance, the lateral straggle of a punch-through stop dopants facilitates a lateral diffusion of the punch-through stop dopant through sidewalls 216 into fins 206. This diffused punch-through stop dopant within fins 206, on exposure to any conventional annealing processes such as, for instance, gate oxidation annealing process, rapid thermal annealing process during subsequent processing, advantageously facilitates forming a desired punch-through stop region 220 within the fins, as illustrated in FIG. 2G.

Further, as discussed above, the ion (i.e., punch-through stop dopant) implantation process has been performed by controlling process parameters such as, for instance, implantation dose, implantation energy, implantation acceleration, such that only an upper portion 218 of the isolation material 210 is implanted. These controlled process parameters advantageously facilitate focusing the lateral diffusion of the punch-through stop dopant into the fin in a region of the fin adjacent to the upper portion of the isolation material, thereby facilitates control of the punch-through stop region location and size within the fins. Additionally, the implantation energy employed during the ion implantation process may be selected and configured to facilitate defining the punch-through stop region size within fins 206. In one example, the implantation energy may be within an energy range of about 1 to 20 keV depending on the dopant employed. Note that, as discussed above, the implantation energy of the well dopant may be substantially higher than the implantation energy of the punch-through stop dopant.

In one embodiment, the punch-through stop dopant may be implanted into the isolation material at an implanting angle which is normal to the upper surface of the fin and/or the upper surface of isolation material 210. Note that the implanting angle being normal to the upper surface of the fin advantageously facilitates preventing the punch-through stop dopant from directly implanting into the fin, thereby further controlling the resultant punch-through stop region location and size. Further note that, protective material 204 disposed over upper surfaces 214 of fins 206 advantageously facilitates preventing the punch-through stop dopant from being implanted into the channel region of the fin. Note that, as discussed above, the low implantation energy employed during the ion implantation process of the punch-through stop dopant is insufficient to facilitate penetrating of the punch-through stop dopant through protective material 204 disposed above the fin, with protective material 204 serving as a mask for the punch-through stop dopant, while the high implantation energy employed during the ion implantation process of the well dopant facilitates penetrating of the well dopant through protective material 204. An additive dopant may optionally be implanted into isolation material 210, along with the punch-through stop dopant. For instance, the additive dopant may include or be a carbon dopant material, which would facilitate controlling lateral diffusion of the punch-through stop dopant into fins 206. Such controlling of the lateral diffusion advantageously facilitates further in controlling the punch-through stop region configuration and size within fins 206.

Figure 2G:
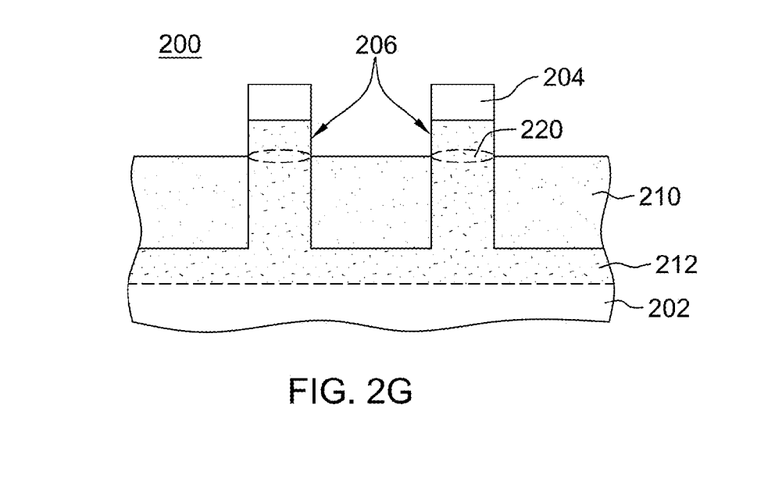
FIG. 2G depicts the structure of FIG. 2F, with a punch-through stop region having been formed within the fin(s) by lateral diffusion of the punch-through stop dopant therein from the isolation material, in accordance with one or more aspects of the present invention.
Figure 2H:
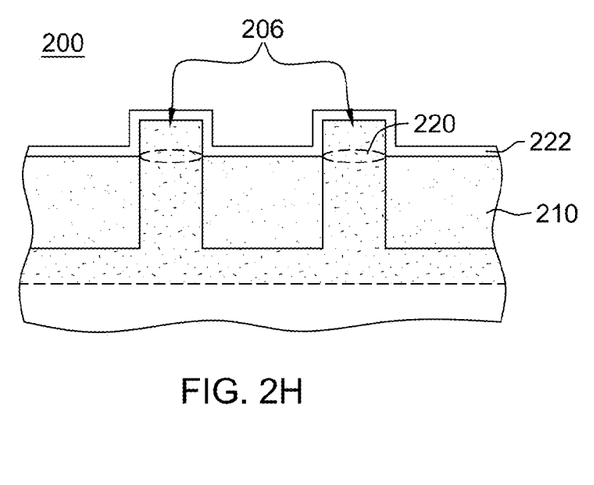
FIG. 2H depicts the structure of FIG. 2G, after removal of the protective material and provision of a conformal oxide layer over the fin(s), in accordance with one or more aspects of the present invention.

FIG. 2H illustrates the structure of FIG. 2G after removal of protective material 204 (see FIG. 2G) and provision of conformal oxide layer 222 over the exposed regions of the structure. Protective material 204 may be selectively removed via, for instance, a non-selective chemical mechanical polish or an etch-back polish, using the upper surfaces of fins 206, as an etch stop. Conformal oxide layer 222 may be provided over the exposed portions of fins 206 and over isolation material 210. In one embodiment, conformal oxide layer 222 may include or be fabricated as a thin oxide material, having a uniform thickness, and may be deposited using any conventional deposition process such as, for instance, chemical vapor deposition, plasma-enhanced CVD process, or an in-situ steam growth (ISSG) process. In one example, an in-situ steam growth (ISSG) process may be performed to conformally form oxidized polycrystalline silicon, and thereby provide conformal oxide layer 222. In such a process, polycrystalline silicon may be deposited concurrently with a steam process in the presence of oxygen to form the oxidized polycrystalline silicon. In one embodiment of an ISSG process performed on a wafer, the process is performed at a low pressure (such as 11 Torr), in a cold wall rapid thermal processing reactor chamber. In such an embodiment, hydrogen ($H_2$) and oxygen ($O_2$) gases are introduced directly into the chamber without pre-combustion, and the hot wafer acts as an ignition source. In one example, the oxidation temperature may be between 900° C. and 1050° C. and a ratio of $H_2:O_2$ may be between 0% and 25%.

Figure 2I:
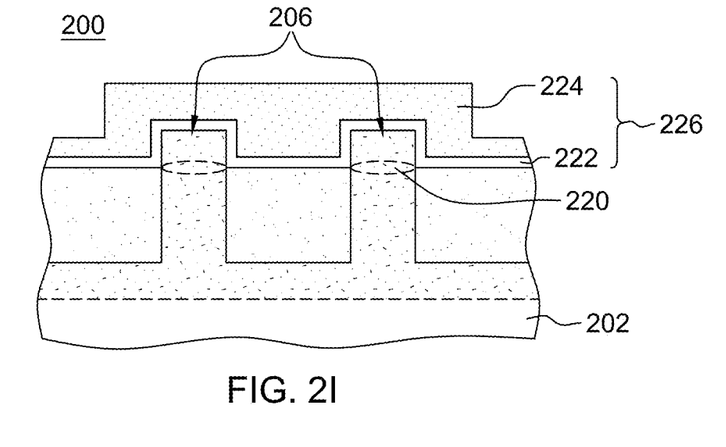
FIG. 2I depicts the structure of FIG. 2H, with a gate material having been provided over the fins, in accordance with one or more aspects of the present invention.

As depicted in FIG. 2I, a gate material 224 may next be provided over conformal oxide layer 222 to form a gate structure 226. Note that, in one embodiment, gate material 224 may include or be fabricated of a metal, and be formed as part of a gate-first fabrication process. Alternatively, in another embodiment, gate material 224 may include or be a sacrificial gate material, such as amorphous silicon (a-Si) or polycrystalline silicon (polysilicon), which may subsequently be replaced with a replacement gate material, as part of a gate-last fabrication process.

Figure 2J:
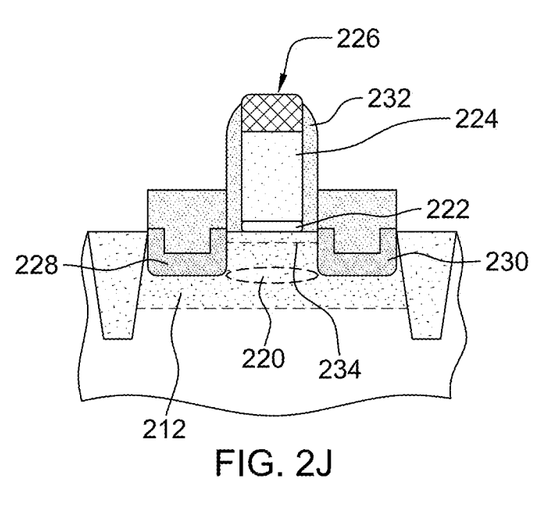
FIG. 2J depicts a transverse view of a resultant FinFET obtained from further processing of the structure of FIG. 2I, wherein the punch-through stop region is shown within the fin below the channel region of the transistor, in accordance with one or more aspects of the present invention.

FIG. 2J depicts a transverse view of the structure of FIG. 2I with the fabrication process proceeding further to form a source region 228 and drain region 230, followed by sidewall spacers 232 along the sidewalls of gate structure 226, as illustrated. Note that, in this example, a channel region 234 underlies gate structure 226 within the fin, with punch-through stop region 220 being disposed within fin 206 beneath channel region 234. By way of example, source region 228 and drain region 230 may be formed using any suitable techniques, including, for example, ion implantation and/or epitaxial growth of embedded source/drain materials. High temperature annealing may be performed to activate the source and drain regions, with the balance of the fin-type field effect transistor being formed, in one example, using a conventional process flow, including providing device contacts to the gate structure, source region and the drain region of fin-type field effect transistor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a fin-type field effect transistor comprising a channel region within a fin, the fabricating comprising:
        establishing a protective material above an upper surface of the fin, and an isolation material adjacent to at least one sidewall of the fin, the isolation material being recessed down from the upper surface of the fin; and
        providing a punch-through stop region within the fin below the channel region, the providing including implanting a punch-through stop dopant into the isolation material and laterally diffusing the punch-through stop dopant from the isolation material into the fin to form the punch-through stop region within the fin beneath the channel region.

2. The method of claim 1, wherein the isolation material is recessed down from the upper surface of the fin for approximately a height of the channel region within the fin.

3. The method of claim 1, wherein the implanting comprises implanting only an upper portion of isolation material to focus the laterally diffusing of the punch-through stop dopant into the fin in a region of the fin adjacent to the upper portion of the isolation material, thereby facilitating control of the punch-through stop region size within the fin.

4. The method of claim 1, wherein the punch-through stop dopant is implanted into the isolation material to a depth of about 1 nm to 20 nm.

5. The method of claim 1, wherein the implanting further comprises implanting the punch-through stop dopant into the isolation material at an implanting angle which is normal to the upper surface of the fin.

6. The method of claim 1, wherein the implanting comprises implanting the punch-through stop dopant into the isolation material with an implantation energy which facilitates defining a desired punch-through stop region size within the fin.

7. The method of claim 6, wherein the implantation energy is within an energy range of about 1 to 20 keV.

8. The method of claim 1, wherein the fabricating comprises implanting a well dopant into the fin to provide a well region within the fin, the channel region to reside within the well region of the fin.

9. The method of claim 8, wherein the well dopant comprises one of an n-type dopant or a p-type dopant, and the fabricating further comprises performing an annealing process, subsequent to the implanting of the well dopant into the fin, to diffuse the well dopant within the fin.

10. The method of claim 9, wherein the implanting of the punch-through stop dopant into the isolation material occurs after the diffusing of the well dopant within the fin.

11. The method of claim 8, wherein the punch-through stop region is disposed, at least in part, within the well region and beneath the channel region.

12. The method of claim 8, wherein the fabricating comprises implanting the well dopant into the fin with a first implantation energy, and implanting the punch-through stop dopant into the isolation material with a second implantation energy, the first implantation energy being higher than the second implantation energy, and the second implantation energy is within an energy range of about 1 to 20 keV.

13. The method of claim 8, wherein the well dopant comprises a first dopant material, and the punch-through stop dopant comprises a second dopant material, the first dopant material and the second dopant material being same dopant material, the same dopant material comprising at least one of boron or phosphorus.

14. The method of claim 1, wherein the establishing comprises depositing the isolation material layer over the fin and selectively removing the isolation material to recess the isolation material down from the upper surface of the fin adjacent to the at least one sidewall of the fin.

15. The method of claim 14, wherein the fin comprises opposite first and second sidewalls, and the isolation material is disposed adjacent to the first sidewall and the second sidewall on opposite sides of the fin.

16. The method of claim 15, wherein the implanting comprises implanting the punch-through stop dopant into the isolation material to facilitate laterally diffusing of the punch-through stop dopant into the fin through the first and the second sidewall on opposite sides of the fin.

17. The method of claim 16, wherein the implanting comprises implanting only an upper portion of isolation material to focus the laterally diffusing of the punch-through stop dopant into the fin in a region of the fin adjacent to the upper portion of the isolation material, thereby facilitating control of the punch-through stop region size within the fin.

18. The method of claim 16, wherein the implanting further comprises implanting the punch-through stop dopant into the isolation material at an implanting angle which is normal to the upper surface of the fin.

19. The method of claim 1, wherein the implanting comprises implanting an additive dopant along with the punch-through stop dopant into the isolation material, to control the lateral diffusing of the punch-through stop dopant into the fin, thereby facilitating controlling punch-through stop region size within the fin.

20. The method of claim 19, wherein the additive dopant comprises a carbon dopant material.

\* \* \* \* \*